(12) United States Patent
Wu et al.

(10) Patent No.: US 10,804,612 B2
(45) Date of Patent: Oct. 13, 2020

(54) ELECTRONIC DEVICE AND ANTENNA STRUCTURE THEREOF

(71) Applicant: PEGATRON CORPORATION, Taipei (TW)

(72) Inventors: Chien-Yi Wu, Taipei (TW);
Ching-Hsiang Ko, Taipei (TW);
Ya-Jyun Li, Taipei (TW); Chao-Hsu Wu, Taipei (TW); Shih-Keng Huang, Taipei (TW); Cheng-Hsiung Wu, Taipei (TW)

(73) Assignee: PEGATRON CORPORATION, Taipei (TW)

( * ) Notice: Subject to any disclaimer, the term of this patent is extended or adjusted under 35 U.S.C. 154(b) by 380 days.

(21) Appl. No.: 15/961,775

(22) Filed: Apr. 24, 2018

(65) Prior Publication Data

US 2018/0342809 A1    Nov. 29, 2018

(30) Foreign Application Priority Data

May 26, 2017   (TW) .............................. 106117491 A (51) Int. Cl.
*H01Q 1/36* (2006.01)
*H01Q 13/10* (2006.01)
*H05K 5/02* (2006.01)
*H05K 5/00* (2006.01)
(Continued)

(52) U.S. Cl.
CPC .............. *H01Q 13/10* (2013.01); *G06F 1/16* (2013.01); *G06F 1/1616* (2013.01);
(Continued)

(58) Field of Classification Search
CPC ...... H01Q 13/10; H01Q 5/371; H01Q 1/2266; H01Q 9/42; H01Q 5/364; H01Q 13/106;
(Continued)

(56) References Cited

U.S. PATENT DOCUMENTS 8,779,999 B2   7/2014   Gummalla
9,209,512 B2   12/2015  Cheng et al.
(Continued)

FOREIGN PATENT DOCUMENTS

TW         I536674        6/2016

*Primary Examiner* — Dimary S Lopez Cruz
*Assistant Examiner* — Bamidele A Jegede
(74) *Attorney, Agent, or Firm* — J.C. Patents (57) ABSTRACT

An antenna structure includes a conductive housing and a feed element. The conductive housing includes an open slot. The feed element includes a substrate, a grounding portion, a shorting portion, a first feeding portion and a second feeding portion. The grounding portion and the shorting portion are connected with the conductive housing. The first feeding portion has a feeding point and is connected with the conductive housing via the shorting portion. The orthographic projections of the first and second feeding portions are within the open slot, and the orthographic projections of the grounding portion and the shorting portion are located at two sides of the open slot, respectively. The antenna structure operates at a first frequency band via a first path formed by the open slot, and operates at a second frequency band via a second path formed by the first and second feeding portions.

19 Claims, 4 Drawing Sheets

(51) Int. Cl.
  *H01Q 5/35* (2015.01)
  *H01Q 5/371* (2015.01)
  *H01Q 1/22* (2006.01)
  *H01Q 9/42* (2006.01)
  *H01Q 5/364* (2015.01)
  *G06F 1/16* (2006.01)
  *H01Q 21/28* (2006.01)

(52) U.S. Cl.
  CPC ......... *G06F 1/1698* (2013.01); *H01Q 1/2266* (2013.01); *H01Q 5/35* (2015.01); *H01Q 5/364* (2015.01); *H01Q 5/371* (2015.01); *H01Q 9/42* (2013.01); *H01Q 13/106* (2013.01); *H05K 5/0017* (2013.01); *H05K 5/0273* (2013.01); *H01Q 21/28* (2013.01)

(58) Field of Classification Search
  CPC ........ H01Q 5/35; H01Q 21/28; G06F 1/1616; G06F 1/16; G06F 1/1698; H05K 5/0273; H05K 5/0017
  See application file for complete search history.

(56) References Cited

U.S. PATENT DOCUMENTS

| | | | |
|---|---|---|---|
| 2009/0079639 A1* | 3/2009 | Hotta | H01Q 1/243 343/702 |
| 2009/0195466 A1* | 8/2009 | Tsai | H01Q 5/371 343/741 |
| 2009/0237308 A1* | 9/2009 | Tsai | H01Q 5/378 343/700 MS |
| 2011/0128185 A1* | 6/2011 | Tsai | H01Q 21/28 343/700 MS |
| 2011/0316760 A1* | 12/2011 | Wu | H01Q 9/42 343/905 |
| 2012/0050134 A1* | 3/2012 | Wu | H01Q 1/2258 343/908 |
| 2012/0068893 A1* | 3/2012 | Guterman | H01Q 1/2266 343/702 |
| 2013/0033411 A1* | 2/2013 | Tsai | H01Q 9/42 343/848 |
| 2013/0077224 A1* | 3/2013 | Mo | G06F 1/1683 361/679.21 |
| 2013/0207853 A1* | 8/2013 | Yamamoto | H01Q 1/002 343/702 |
| 2013/0225234 A1* | 8/2013 | Cheng | H01Q 5/00 455/552.1 |
| 2014/0071005 A1* | 3/2014 | Wang | H01Q 21/28 343/725 |
| 2014/0125528 A1* | 5/2014 | Tsai | H01Q 13/106 343/702 |
| 2014/0184453 A1* | 7/2014 | Chen | H01Q 13/16 343/725 |
| 2015/0145743 A1 | 5/2015 | Du et al. | |
| 2017/0005414 A1* | 1/2017 | Yang | H01Q 5/378 |

* cited by examiner

ELECTRONIC DEVICE AND ANTENNA STRUCTURE THEREOF

RELATED APPLICATIONS

This application claims priority to Taiwan Application Serial Number 106117491, filed May 26, 2017, which is herein incorporated by reference.

BACKGROUND

Technical Field

The disclosure relates to an electronic device and, in particular, to an electronic device having a conductive housing having an open slot and the antenna structure thereof.

Related Art

In recent years, most notebook computers adopt a narrow bezel design and a conductive shell with a metal texture, thereby emphasizing the uniqueness of the product and attracting the attention of consumers. In response to the needs of narrow bezel design, the antenna structure of a notebook computer is often disposed at the plastic hinge under the display panel. In addition, the signal bus of the display panel also across the plastic hinge to be connected with the electronic components located at the two bodies of the notebook computer, respectively. However, to reduce the influence on the bus signal caused by the antenna, the antenna structure disposed at the plastic hinge often needs to be disposed away from signal bus, which further occupies more space within the notebook computer. Moreover, the conductive housing of the notebook computer often affects the radiation characteristics of the antenna structure. Therefore, under the design requirements of a narrow bezel and a conductive housing, how to reduce the space occupied by the antenna structure and improve its radiation characteristics has become an important issue of antenna design for a notebook computer.

SUMMARY

The disclosure provides an electronic device and the antenna structure thereof, which can reduce the space occupied by the antenna structure and improve the radiation characteristics of the antenna structure.

The antenna structure of the present disclosure includes a conductive housing and a feed element. The conductive housing includes an open slot. The feed element includes a substrate, a grounding portion, a shorting portion, a first feeding portion and a second feeding portion. The substrate includes a first surface and a second surface opposite to each other, and the second surface faces the conductive housing. The grounding portion and the shorting portion are electrically connected with the conductive housing, respectively, and the orthographic projections of the grounding portion and the shorting portion on the conductive housing are located at two opposite sides of the open slot, respectively. The first feeding portion is disposed at the first surface and has a feeding point. The first feeding portion is electrically connected with the conductive housing via the shorting portion. The second feeding portion is disposed at the first surface, and is electrically connected with the first feeding portion. The second feeding portion and the grounding portion are separated by a first coupling gap. The orthographic projections of the first feeding portion and the second feeding portion on the conductive housing are within the open slot. The first and second feeding portions resonate the antenna structure, and the antenna structure operates at a first frequency band via a first path formed by the open slot, and operates at a second frequency band via a second path formed by the first feeding portion and the second feeding portion.

The electronic device of the present disclosure includes a hinge, a first body, a second body and a feed element. The first body and the second body are rotatable with respect to each other via the hinge. A conductive housing in the first body includes an open slot and a corner adjacent to the hinge, and the open slot is adjacent to the corner. The feed element and the open slot form the antenna structure, and the feed element includes a substrate, a grounding portion, a shorting portion, a first feeding portion and a second feeding portion. The substrate includes a first surface and a second surface opposite to each other, and the second surface faces the conductive housing. The grounding portion and the shorting portion are electrically connected with the conductive housing, respectively, and the orthographic projections of the grounding portion and the shorting portion on the conductive housing are located at two opposite sides of the open slot, respectively. The first feeding portion is disposed at the first surface and has a feeding point. The first feeding portion is electrically connected with the conductive housing via the shorting portion. The second feeding portion is disposed at the first surface, and is electrically connected with the first feeding portion. The second feeding portion and the grounding portion are separated by a first coupling gap. The orthographic projections of the first feeding portion and the second feeding portion on the conductive housing are within the open slot. The first and second feeding portions resonate the antenna structure, and the antenna structure operates at a first frequency band via a first path formed by the open slot, and operates at a second frequency band via a second path formed by the first feeding portion and the second feeding portion.

Based on the above, the present disclosure uses the open slot and the feed element of the conductive housing to form an antenna structure. Such configuration can reduce the space occupied by the antenna structure in the electronic device, and is helpful to improve the radiation characteristics of the antenna structure. Furthermore, the open slot is adjacent to a corner of the conductive housing adjacent to the hinge, that is, the open slot is formed at one side above the hinge. This reduces the effect to the antenna structure caused by the signal bus of the display panel, which further improves the radiation characteristics of the antenna structure.

The disclosure will become more fully understood from the detailed description and accompanying drawings, which are given for illustration only, and thus are not limitative of the present disclosure.

DETAILED DESCRIPTION OF THE EMBODIMENT

Figure 1:
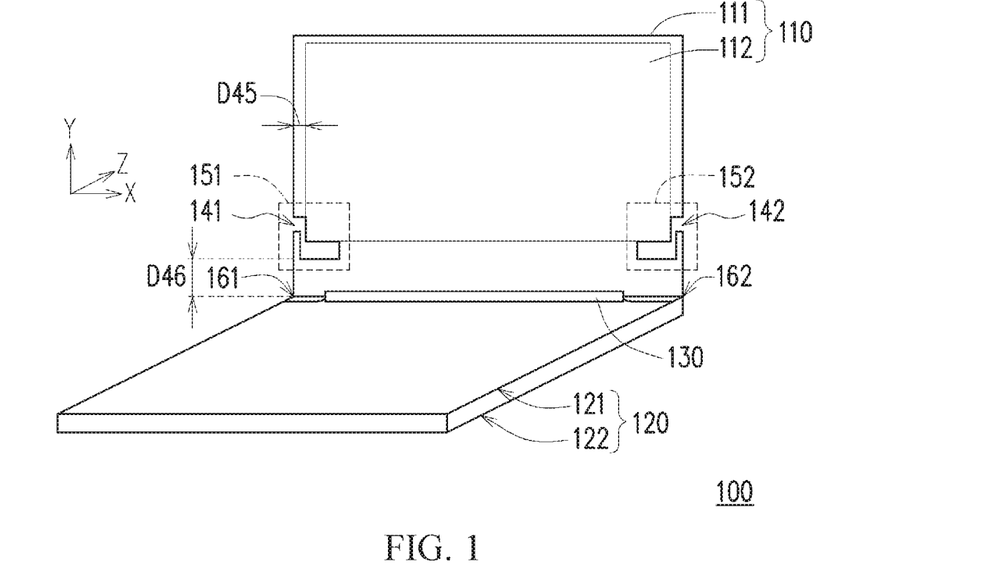
FIG. 1 is a schematic diagram showing an electronic device according to one embodiment of the disclosure.

FIG. 1 is a schematic diagram showing an electronic device according to one embodiment of the disclosure. As shown in FIG. 1, the electronic device 100 may be, for example, a notebook computer, and the electronic device 100 includes a first body 110, a second body 120 and a hinge 130. The hinge 130 is disposed between the first body 110 and the second body 120 so that the first body 110 and the second body 120 can rotate with respect to each other via the hinge 130. Moreover, the first body 110 includes a conductive housing 111 and a display panel 112. For concise purpose, FIG. 1 does not include the conductive frame surrounding the display panel 112. The second body 120 includes a conductive housing 121 and a conductive housing 122. The electronic device 100 further includes a keyboard (not shown in the drawings) disposed at the conductive housing 121.

The conductive housing 111 includes an open slot 141 and an open slot 142. The open slot 141 and the open slot 142 can form an antenna structure together with a feed element in the electronic device 100. In other words, two antenna structures 151 and 152 can be formed in the electronic device 100 using the two open slots 141 and 142. For the convenient of explanation, the positions of the antenna structures 151 and 152 are shown in FIG. 1 in dotted lines only. In another embodiment, only one open slot 141 or 142 can be formed on the conductive housing 111, thereby forming a single antenna structure 151 or 152.

It is noteworthy that since the conductive housing 111 is a portion of the antenna structures 151 and 152, the space occupied by the antenna structures 151 and 152 in the electronic device 100 can be reduced. Furthermore, the radiation characteristics of the antenna structures 151 and 152 can be improved since the effect caused by the conductive housings of the electronic device 100 (such as the conductive housings 111, 121 and 122) against the antenna structures 151 and 152 can be reduced.

In the overall configuration, the conductive housing 111 can further includes two corners 161 and 162 adjacent to the hinge 130, and the two open slots 141 and 142 are adjacent to the two corners 161 and 162 of the conductive housing 111, respectively. In other words, the two open slots 141 and 142 are formed at the two sides above the hinge 130, which means that the two antenna structures 151 and 152 are located at the two sides above the hinge 130. With such configuration, the effect to the antenna structures formed by the two open slots 141 and 142 caused by the signal bus of the display panel 112 can be reduced significantly, which further improves the radiation characteristics of the antenna structure 151 and 152.

Compared to the conventional antenna structures disposed above the display panel 112, the antenna structures 151 and 152 at the two sides above the hinge 130 is closer to the electronic components in the second body 120 (such as the transceiver of a Wi-Fi wireless module, referred to as "transceiver" hereinbelow). With such configuration, the transmission wires (such as coaxial cables) connecting the two antenna structures 151 and 152 to the transceiver can be shortened, thereby reducing the effect to the antenna structures caused by the power loss of the transmission wires. Moreover, the orthographic projection of the display panel 112 on the conductive housing 111 does not overlap with the two open slots 141 and 142 on the conductive housing 111. With such arrangement, the effect to the antenna structures caused by the display panel 112 can be reduced, which further improves the radiation characteristics of the antenna structures.

Figure 2:
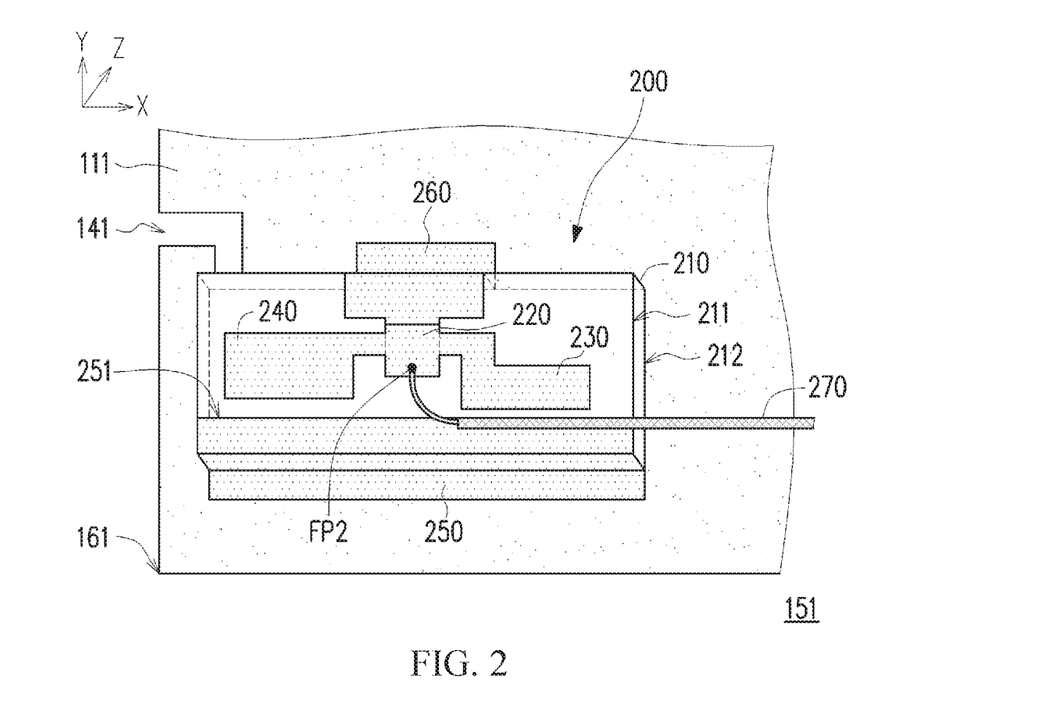
FIG. 2 is a schematic diagram showing an antenna structure according to an embodiment of the disclosure.

For the persons having ordinary skill in the art to further understand the invention, the antenna structure 151 formed by the open slot 141 of the conductive housing 111 will be explained with examples. FIG. 2 is a schematic diagram showing an antenna structure according to an embodiment of the disclosure. As shown in FIG. 2, the antenna structure 151 includes the conductive housing 111 and a feed element 200. The feed element 200 includes a substrate 210, a first feeding portion 220, a second feeding portion 230, a third feeding portion 240, a grounding portion 250, a shorting portion 260 and a coaxial cable 270. The substrate 210 includes a first surface 211 and a second surface 212 opposite to each other, and the second surface 212 of the substrate 210 faces to conductive housing 111. That is, the second surface 212 is attached on the conductive housing 111.

The first to third feeding portions 220-240 are disposed on the first surface 211 of the substrate 210, and the first to third feeding portions 220-240 are located between the grounding portion 250 and the shorting portion 260. The third feeding portion 240, the first feeding portion 220 and the second feeding portion 230 are sequentially arranged along the direction of the +X axis, that is, sequentially arranged along an edge 251 of the grounding portion 250. A part of the grounding portion 250 is disposed at the first surface 211 of the substrate 210. In addition, the grounding portion 250 extends along the direction of the −Y axis to the above of the conductive housing 111, and the part of the grounding portion 250 above the conductive housing 111 is electrically connected with the conductive housing 111. A part of the shorting portion 260 is disposed at the first surface 211 of the substrate 210. Moreover, the shorting portion 260 extends along the direction of the +Y axis to the above of the conductive housing 111, and the part of the shorting portion 260 above the conductive housing 111 is electrically connected with the conductive housing 111.

Figure 3:
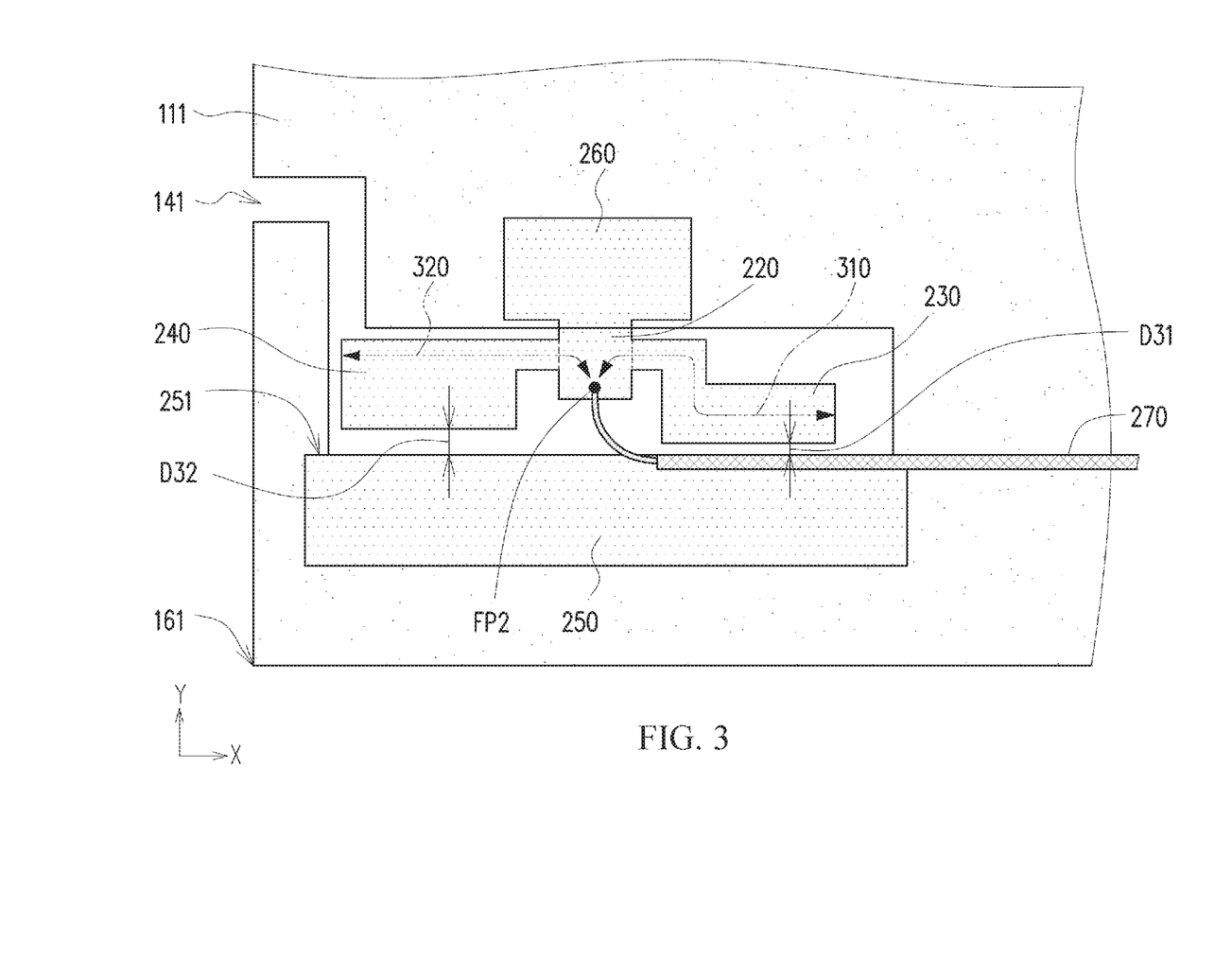
FIG. 3 is a schematic diagram illustrating the projection of the antenna structure shown in FIG. 2.

FIG. 3 is a schematic diagram illustrating the projection of the antenna structure shown in FIG. 2. For convenience of explanation, the substrate 210 shown in FIG. 2 is not shown in FIG. 3. Referring to FIG. 2 and FIG. 3. The first feeding portion 220 has a feeding point FP2, and is electrically connected with the conductive housing 111 via the shorting portion 260. One end of the second feeding portion 230 is electrically connected with the first feeding portion 220, and another end of the second feeding portion 230 is an open end. One end of the third feeding portion 240 is electrically connected with the first feeding portion 220, and another and of the third feeding portion 240 is an open end. Moreover, the second feeding portion 230 and an edge 251 of the grounding portion 250 are separated by a first coupling gap D31, and the third feeding portion 240 and the edge 251 of the grounding portion 250 are separated by a second coupling gap D32.

As shown in FIG. 3, in the overall configuration, the orthographic projections of the first to the third feeding portions 220-240 on the conductive housing 111 are located in the open slot 141 of the conductive housing 111. That is, the orthographic projections of the first to the third feeding portions 220-240 on the conductive housing 111 overlap with the open slot 141 of the conductive housing 111. The orthographic projections of the grounding portion 250 and the shorting portion 260 on the conductive housing 111 are located at the two opposite sides of the open slot 141 of the conductive housing 111. In other words, the first to third feeding portions 220-240 are located above the open slot 141 via the substrate 210. In one embodiment, the size of the substrate 210 may be 20 mm×8 mm×0.4 mm. Furthermore, the thickness of the substrate 210 is preferably less than 1 mm to thereby enhance the coupling mechanism between the first to third feeding portions 220-240 and the open slot 141.

During operation, the feeding point FP2 of the first feeding portion 220 may be electrically connected with the transceiver in the electronic device 100 via the coaxial cable 270. The feeding point FP2 is electrically connected with the inner conductor of the coaxial cable 270, and the grounding portion 250 is electrically connected with the outer conductor of the coaxial cable 270. With such configuration, the feeding signals from the transceiver may be transmitted to the first to third feeding portions 220-240 via the coaxial cable 270. Moreover, the first to third feeding portions 220-240 may be used to resonate the antenna structure 151 to enable the antenna structure 151 to operate within first to the third frequency bands.

Figure 4:
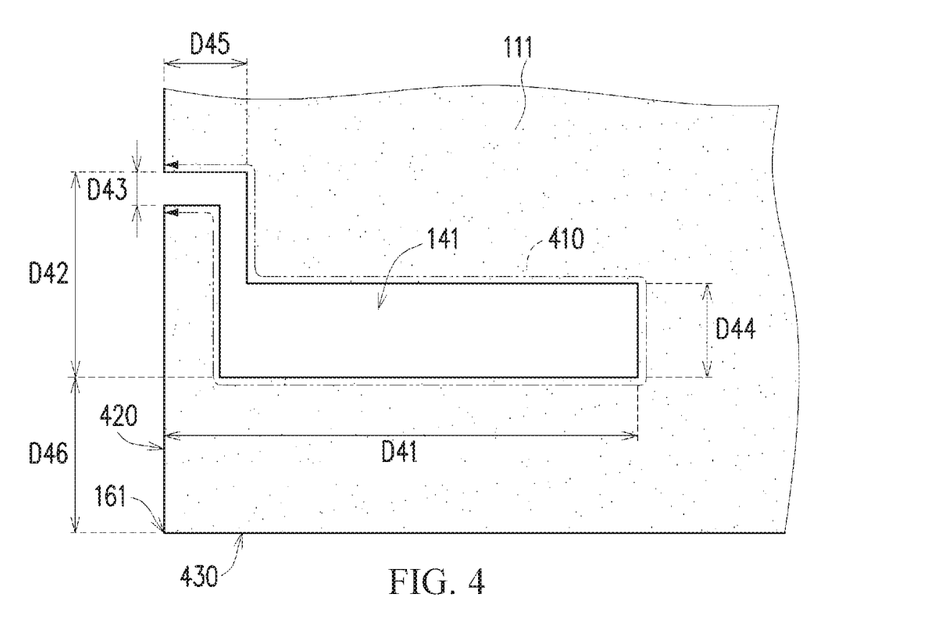
FIG. 4 is a schematic diagram showing the open slot according to an embodiment of the disclosure.

Specifically speaking, FIG. 4 is a schematic diagram showing the open slot according to an embodiment of the disclosure. As shown in FIG. 4, a first path 410 may be formed around the open slot 141. Moreover, by the resonance of the first feeding portion 220, the antenna structure 151 can generate a first resonant mode to operate in the first frequency band. The length of the first path, that is, the length of the perimeter of the open slot 141, is about a quarter of the wavelength of the lowest frequency of the first frequency band. In other words, a person having ordinary skill in the art may adjust the shape and/or size of the open slot 141 to adjust the frequency of the first frequency band according to design requirements.

For example, as shown in FIG. 4, the length D41 and the width D42 of the open slot 141 may be 19 mm and 11 mm, respectively. The width D43 of the opening of the open slot 141 may be 3 mm, while the width D44 of the bottom of the open slot 141 may be 5 mm. In the present embodiment, the open slot 141 includes two bends to form a Z-shaped slot. Furthermore, the distance D45 from the opening of the open slot 141 to the first bend is 4 mm. With such configuration, the frequency range of the first frequency band of the antenna structure 151 may be 2.4 GHz-2.5 GHz. Moreover, in one embodiment, the open slot 141 on the conductive housing 111 may be realized by insert molding techniques, and the outer appearance of the conductive housing 111 can be modified by spray painting techniques.

Furthermore, since the distance D45 from the opening of the open slot 141 to the first bend is 4 mm, the width of the conductive frame surrounding the display panel 112 may also me 4 mm. This satisfies the design requirement of a narrow bezel of the electronic device 100. Moreover, as shown in FIG. 1 and FIG. 4, the edges 420 and 430 of the conductive housing 111 may be used to form the corner 161, and the distance D46 between the open slot 141 and the edge 430 of the conductive housing 111 may be 15 mm. This helps to improve the appearance design of the electronic device 100.

Referring to FIG. 3, the first feeding portion 220 and the second feeding portion 230 may be used to form a second path 310. Moreover, under the resonance of the first feeding portion 220 and the second feeding portion 230, the antenna structure 151 can generate a second resonant mode to operate at the second frequency band. The second path 310 extends from the feeding point FP2 to the open end of the second feeding portion 230, and the length of the second path is about a quarter of the wavelength of the lowest frequency of the second frequency band. In other words, a person having ordinary skill in the art may adjust the shape and/or size of the second feeding portion 230 according to design requirements to adjust the frequency of the second frequency band. For example, the second feeding portion 230 of the present embodiment has a plurality of bends. In another embodiment, the shape of the second feeding portion 230 may be a rectangle.

The first feeding portion 220 and the third feeding portion 240 may be used to form a third path 320. Under the resonance of the first feeding portion 220 and the third feeding portion 240, the antenna structure 151 can generate a third resonant mode to operate at the third frequency band. The third path 320 extends from the feeding point FP2 to the open end of the third feeding portion 240, and the length of the third path is about a quarter of the wavelength of the lowest frequency of the third frequency band. In other words, a person having ordinary skill in the art may adjust the shape and/or size of the third feeding portion 240 according to design requirements to adjust the frequency of the third frequency band. For example, the third feeding portion 240 of the present embodiment includes a slot. In another embodiment, the shape of the third feeding portion 240 may be a rectangle.

It is noteworthy that the width D43 of the open end of the open slot 141 and the width of the first feeding portion 220 may be used to adjust the impedance matching of the antenna structure 151 operating within the first frequency band. The first coupling gap D31 and the second coupling gap D32 may be used to adjust the impedance matchings of the antenna structure 151 operating within the second frequency band and the third frequency band, respectively. In one embodiment, the center frequency of the second frequency band is higher than the center frequency of the third frequency band, and the first coupling gap D31 is shorter than the second coupling gap D32.

For example, the frequency range of the second frequency band may be 5.7 GHz-5.875 GHz, and the frequency range of the third frequency band may be 5.15 GHz-5.7 GHz. The first coupling gap D31 may be 0.5 mm, and the second coupling gap may be 1 mm. Moreover, a person having ordinary skill in the art may remove the second feeding portion 230 or the third feeding portion 240 according to design requirements, so that the antenna structure 151 can operate within one of the second frequency band or the third frequency band except for the first frequency band.

Figure 5:
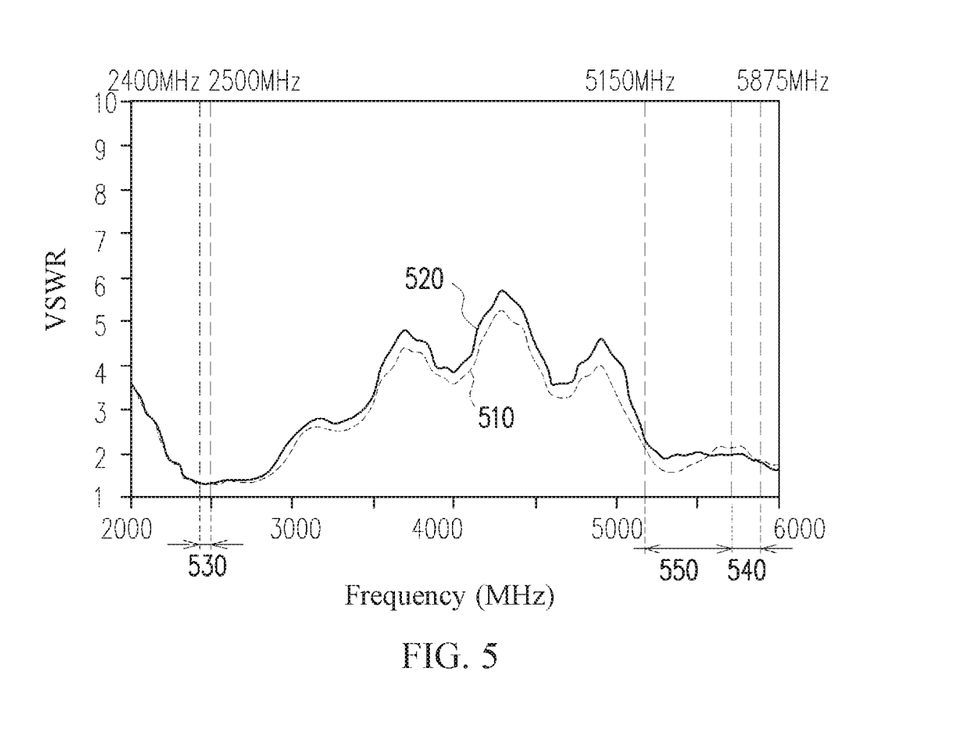
FIG. 5 is a diagram showing the VSWRs (Voltage Standing Wave Ratio) of the antenna structures according to an embodiment of the disclosure.
Figure 6:
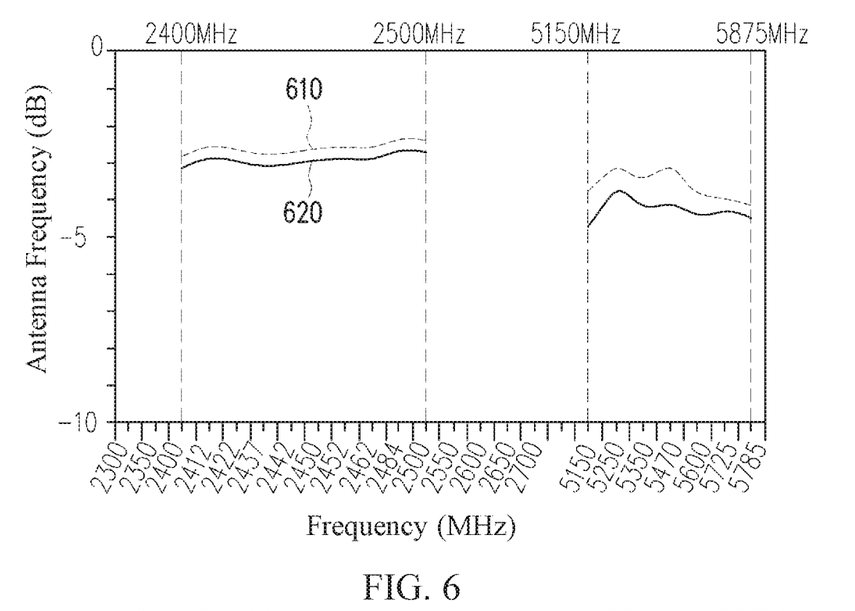
FIG. 6 is a diagram showing the antenna efficiencies of the antenna structures according to an embodiment of the disclosure.

Referring to FIG. 1, the two antenna structures 151 and 152 of the electronic device 100 have the same configuration, and both have good radiation characteristics. For example, FIG. 5 is a diagram showing the VSWRs (Voltage Standing Wave Ratio) of the antenna structures according to an embodiment of the disclosure, and FIG. 6 is a diagram showing the antenna efficiencies of the antenna structures according to an embodiment of the disclosure. Curves 510 and 520 in FIG. 5 represent the VSWRs of the antenna structures 151 and 152, respectively, and curves 610 and 620 in FIG. 6 represent the antenna efficiencies of the antenna structures 510 and 520, respectively.

Figure 7:
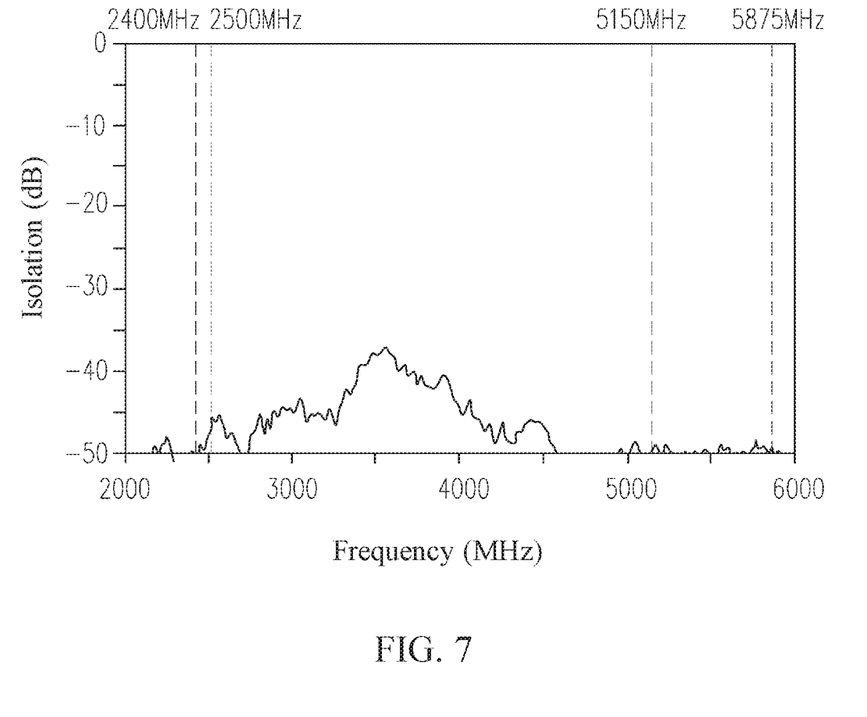
FIG. 7 is a diagram showing the isolation of the antenna structure according to an embodiment of the disclosure.

In the embodiments shown in FIG. 5 and FIG. 6, two antenna structures 151 and 152 are electrically connected with the same transceiver in the second body 120 via two coaxial cables having lengths of 150 mm and 500 mm, respectively. In addition, as shown in FIG. 5 and FIG. 6, the two antenna structures 151 and 152 can both operate within the first frequency band 530 (such as 2.4 GHz-2.5 GHz), the second frequency band 540 (such as 5.7 GHz-5.875 GHz) and the third frequency band 550 (such as 5.15 GHz-5.7 GHz). Furthermore, the VSWRs of the two antenna structures 151 and 152 in the first to third frequencies 530~550 are all smaller than 3. The antenna efficiencies of the two antenna structures 151 and 152 within the first frequency band 530 are −2.4 dB~−3.1 dB, and the antenna efficiencies of the two antenna structures 151 and 152 within the second and the third bands 540 and 550 are −3.1 dB to 4.8 dB. Moreover, FIG. 7 is a diagram showing the isolation (S21) of the antenna structure according to an embodiment of the disclosure. In the embodiment of FIG. 7, the distance between the two antenna structures 151 and 152 is 300 mm, and the isolations of the two antenna structures 151 and 152 within the first to third frequency bands 530-550 are all below −40 dB.

To sum up, the disclosure uses the open slot and the feed element of the conductive housing to form an antenna structure. Such configuration can reduce the space occupied by the antenna structure in the electronic device, and is helpful to improve the radiation characteristics of the antenna structure. Furthermore, the open slot is adjacent to a corner of the conductive housing adjacent to the hinge, that is, the open slot is formed at one side above the hinge. This reduces the effect to the antenna structure caused by the signal bus of the display panel, which further improves the radiation characteristics of the antenna structure. Moreover, the orthographic projection of the display panel on the conductive housing does not overlap with the open slot. Therefore, the effect to the antenna structure caused by the display panel is reduced, which further improves the radiation characteristics of the antenna structure.

Although the invention has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the invention.

What is claimed is:

1. An antenna structure, comprising:
    a conductive housing including an open slot; and
    a feed element, including:
        a substrate including a first surface and a second surface opposite to each other, the second surface facing the conductive housing,
        a grounding portion and a shorting portion electrically connected with the conductive housing, respectively, orthographic projections of the grounding portion and the shorting portion on the conductive housing being located at two opposite sides of the open slot, respectively,
        a first feeding portion disposed at the first surface and having a feeding point, the first feeding portion being electrically connected with the conductive housing via the shorting portion, and
        a second feeding portion disposed at the first surface and electrically connected with the first feeding portion, the second feeding portion and the grounding portion being separated by a first coupling gap, orthographic projections of the first feeding portion and the second feeding portion on the conductive housing being within the open slot,
    wherein the first feeding portion and the second feeding portion resonate the antenna structure, and the antenna structure operates at a first frequency band via a first path formed by the open slot, and operates at a second frequency band via a second path formed by the first feeding portion and the second feeding portion.

2. The antenna structure according to claim 1, wherein the open slot is a z-shaped slot.

3. The antenna structure according to claim 1, wherein the feeding point of the first feeding portion is electrically connected with an inner conductor of a coaxial cable, and the grounding portion is electrically connected with an outer conductor of the coaxial cable.

4. The antenna structure according to claim 1, wherein the length of the first path is a quarter of the wavelength of the lowest frequency of the first frequency band.

5. The antenna structure according to claim 4, wherein the second path extends from the feeding point to an open end of the second feeding portion, and the length of the second path is a quarter of the wavelength of the lowest frequency of the second frequency band.

6. The antenna structure according to claim 1, wherein the feed element further comprises: a third feeding portion disposed at the first surface and being electrically connected with the first feeding portion, the third feeding portion and the grounding portion are separated by a second coupling gap, and an orthographic projection of the third feeding portion on the conductive housing is within the open slot, wherein the third feeding portion resonates the antenna structure, and the antenna structure operates at a third frequency band via a third path formed by the first feeding portion and the third feeding portion.

7. The antenna structure according to claim 6, wherein the third path extends from the feeding point to the open end of the third feeding portion, and the length of the third path is a quarter of the wavelength of the lowest frequency of the third frequency band.

8. The antenna structure according to claim 6, wherein the first feeding portion, the second feeding portion and the third feeding portion are located between the grounding portion and the shorting portion, and the third feeding portion, the first feeding portion and the second feeding portion are sequentially arranged along an edge of the grounding portion.

9. The antenna structure according to claim 6, wherein the center frequency of the second frequency band is higher than the center frequency of the third frequency band, and the first coupling gap is shorter than the second coupling gap.

10. An electronic device, comprising:
    a hinge;
    a first body and a second body being rotatable with respect to each other via the hinge, wherein a conductive housing in the first body includes an open slot and a corner adjacent to the hinge, and the open slot being adjacent to the corner; and
    a feed element forming an antenna structure with the open slot, and including
        a substrate including a first surface and a second surface opposite to each other, the second surface facing the conductive housing,
        a grounding portion and a shorting portion electrically connected with the conductive housing, respectively; orthographic projections of the grounding portion and the shorting portion on the conductive housing being located at two opposite sides of the open slot, respectively, a first feeding portion disposed at the first surface and having a feeding point, the first feeding portion being electrically connected with the conductive housing via the shorting portion, and a second feeding portion disposed at the first surface and electrically connected with the first feeding portion, the second feeding portion and the grounding portion being separated by a first coupling gap, orthographic projections, of the first feeding portion and the second feeding portion on the conductive housing being within the open slot, wherein the first feeding portion and the second feeding portion resonate the antenna structure, and the antenna structure operates at a first frequency band via a first path formed by the open slot, and operates at a second frequency band via a second path formed by the first feeding portion and the second feeding portion.

11. The electronic device according to claim 10, wherein the first body further includes a display panel, and an orthographic projection of the display panel on the conductive housing does not overlap with the open slot.

12. The electronic device according to claim 10, wherein the open slot is a z-shaped slot.

13. The electronic device according to claim 10, wherein the feeding point of the first feeding portion is electrically connected with an inner conductor of a coaxial cable, and the grounding portion is electrically connected with an outer conductor of the coaxial cable.

14. The electronic device according to claim 10, wherein the length of the first path is a quarter of the wavelength of the lowest frequency of the first frequency band.

15. The electronic device according to claim 14, wherein the second path extends from the feeding point to the open end of the second feeding portion, and the length of the second path is a quarter of the wavelength of the lowest frequency of the second frequency band.

16. The electronic device according to claim 10, wherein the feed element further comprises: a third feeding portion disposed at the first surface and being electrically connected with the first feeding portion, the third feeding portion and the grounding portion are separated by a second coupling gap, and an orthographic projection of the third feeding portion on the conductive housing is within the open slot, wherein the third feeding portion resonates the antenna structure, and the antenna structure operates at a third frequency band via a third path formed by the first feeding portion and the third feeding portion.

17. The electronic device according to claim 16, wherein the third path extends from the feeding point to the open end of the third feeding portion, and the length of the third path is a quarter of the wavelength of the lowest frequency of the third frequency band.

18. The electronic device according to claim 16, wherein the first feeding portion, the second feeding portion and the third feeding portion are located between the grounding portion and the shorting portion, and the third feeding portion, the first feeding portion and the second feeding portion are sequentially arranged along an edge of the grounding portion.

19. The electronic device according to claim 16, wherein the center frequency of the second frequency band is higher than the center frequency of the third frequency band, and the first coupling gap is shorter than the second coupling gap.

* * * * *

UNITED STATES PATENT AND TRADEMARK OFFICE
CERTIFICATE OF CORRECTION

PATENT NO. : 10,804,612 B2  
APPLICATION NO. : 15/961775  
DATED : October 13, 2020  
INVENTOR(S) : Chien-Yi Wu et al.

Page 1 of 1

It is certified that error appears in the above-identified patent and that said Letters Patent is hereby corrected as shown below:

In the Claims

Column 9, Line 12, please replace sentence "orthographic projections, of the first feeding portion" with --orthographic projections of the first feeding portion--

Signed and Sealed this  
Twenty-ninth Day of December, 2020

Andrei Iancu  
*Director of the United States Patent and Trademark Office*